United States Patent [19]

Förster et al.

[11] Patent Number: 4,713,353

[45] Date of Patent: Dec. 15, 1987

[54] METHOD OF PRODUCING A TRANSPARENT PHOTOCATHODE

[75] Inventors: Rudolf Förster, Tomerdingen; Suso Weber, Langenau; Hans-Jürgen Pyka, Nersingen, all of Fed. Rep. of Germany

[73] Assignee: Licentia Patent-Verwaltungs GmbH, Fed. Rep. of Germany

[21] Appl. No.: 881,967

[22] Filed: Jul. 3, 1986

[30] Foreign Application Priority Data

Jul. 11, 1985 [DE] Fed. Rep. of Germany ....... 3524765

[51] Int. Cl.[4] .......................................... H01L 31/00

[52] U.S. Cl. ...................................... 437/2; 437/225; 437/249; 156/645; 313/542

[58] Field of Search ......................... 29/572, 580, 583; 156/645, 652, 656; 313/542

[56] References Cited

U.S. PATENT DOCUMENTS 3,901,745 8/1975 Pion ................................... 148/171

3,959,045 5/1976 Antypas ............................. 148/175

4,295,923 10/1981 Kasper ................................ 29/572

FOREIGN PATENT DOCUMENTS 2550056 5/1976 Fed. Rep. of Germany .

*Primary Examiner*—Brian E. Hearn
*Assistant Examiner*—Kevin McAndrews
*Attorney, Agent, or Firm*—McGlew and Tuttle

[57] ABSTRACT

A method of producing a transparent photocathode comprises applying a multi-layer wafer to a carrier service so that the wafer projects beyond the carrier on all sides, effecting a chemical denudation on the substrate and after the chemical denudation on the substrate removing at least the overhanging parts of the multi-layer wafer mechanically. Chemical denudations are advantageously made by etching. The substrate comprises a gallium arsenide. The subsequent layers in the active photocathode semiconductor layer are applied by an epitaxial process.

8 Claims, 5 Drawing Figures

METHOD OF PRODUCING A TRANSPARENT PHOTOCATHODE

FIELD AND BACKGROUND OF THE INVENTION

Transparent photocathodes, also called inverted transmission cathodes, are usually produced by building a multi-layer, large area heterostructure on a semiconductor substrate by an epitaxial process. An etch resist layer, an active semi-conductor layer and a protective layer are successively applied from appropriate melts to a substrate in a liquid epitaxial process. After expediently having applied to the protective layer pyrolitically an adhesive coating. this multi-layer wafer is jointed to a carrier, preferably of glass, e.g. by heat treatment in a furnace. Thereafter, parts of the multilayer wafer, in particular the substrate, are removed completely or partly by etching. The various layer thicknesses are in the order of magnitude of a few μm. The size of the multilayer semiconductor wafer is usually of the same size, or smaller than, the carrier surface to which it is applied. The method used for this purpose is known, e.g. from German OS No. 25 50 056.

As a disadvantage, difficulties were often encountered in contacting the active semiconductor layer and in the appearance of undesirable discharge phenomena during the operation of image intensifier tubes with such a photocathode, irregularities at the photocathode edges having been found as the cause of these difficulties.

The cause of these irregularities obviously was that when etching away especially the substrate after the application of the multi-layer semiconductor wafer to the glass carrier, there were also dissolved, despite the use of maskings at the rim, parts of the active semiconductor layer between the resist layer and the protective layer, with parts of these adjacent layers then crumbling off subsequently. These irregularities impaired bondings, e.g. produced by vacuum metallizing on the one hand, and they caused undesired discharge phenomena on the other.

SUMMARY OF THE INVENTION

The invention provides a production method which insures that the occurrence of the described irregularities at the edges of such photocathodes are minimized.

A method of producing a transparent photocathode in which one side of a wafer shaped semiconductor substrate is provided with several superposed layers and one layer is an active photocathode semiconductive layer and the layered side of this multilayer wafer is connected to a surface of a carrier which comprises applying a multi-layer wafer to the carrier surface so that the wafer projects beyond carrier on all sides, effecting a chemical denudation to the wafer and after the chemical denudation are made the substrate of at least the overhanging parts of the multi-layer wafer are removed mechanically.

A further object of the invention is to provide a method of producing a transparent photocathode which is simple to execute and inexpensive.

DESCRIPTION OF THE PREFERRED EMBODIMENTS

Figure 1:
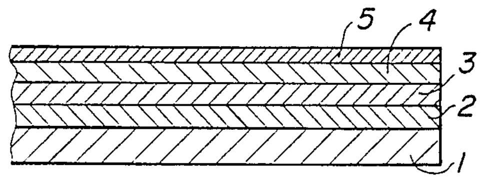
FIG. 1 is a sectional view of a part of a multi-layer semiconductor wafer.

FIG. 1 shows, in section, a part of a multi-layer semiconductor wafer. The layers 2,3 and 4 are applied to the substrate 1 by superposing them, preferably by an epitaxial process. The substrate 1 comprises a GaAs semiconductor wafer. The layer 2. having the function of an etch resist layer, is preferably a Zn-doped GaAlAs layer. the layer 3 is the active semiconductor layer of Zn-doped GaAs, and the layer 4, having the function of a protective glass sealing layer is agains a Zn-doped GaAlAs layer. The active GaAs layer 3 is thus sandwiched between two GaAlAs layers 2 and 4. It is expedient to provide also a layer 5 as glass seal adhesive layer comprising e.g. of pyrolitically applied $Si_5N_4$ or $SiO_2$.

Figure 2:
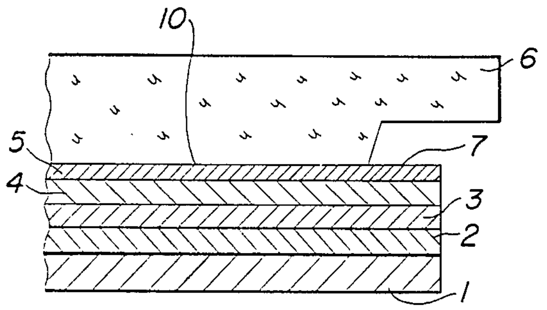
FIG. 2 is a view a multi-layer semiconductor wafer after been bonded to a glass carrier.
Figure 3:
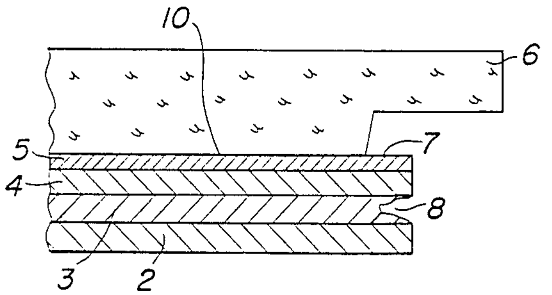
FIG. 3 is a view similar to FIG. 2 of an intermediate product.

FIG. 2 shows the multi-layer semiconductor wafer after having been bonded in a glass sealing furnace to a glass carrier 6 by means of the adhesive layer 5. According to the invention, this connection was made so that an overhanging rim 7 of the multi-layer wafer is formed. For this purpose the multi-layer wafer is made bigger than the bonding area 10 of the carrier 6. Subsequently, the substrate 1 is etched away by an etching agent which does not attack the resist layer and the glass seal layer so that an intermediate product shown in FIG. 3 results. It may be seen that, while etching away the substratel, a part 8 of the active semiconductor layer 3 was also etched out at the edge. According to the invention, the overhanging rim 7 of the multilayer wafer should be at least as big as the part 8 which can be etched out of the layer 3.

Figure 4:
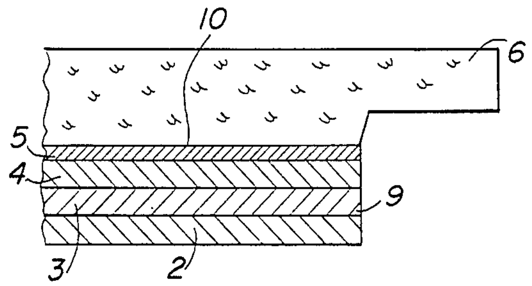
FIG. 4 is a sectional view of a photocathode in the state after removal of the overhanging rim.

FIG. 4 shows the photocathode in a state after the removal of the overhanging rim 7, in which the etched-out parts 8 are present at the peripherey of layer 3, by breaking it off or by means of ultrasound or laser radiation.

Now an exact margin area 9 is present which no longer has indentations. The etch resist layer can now be removed completely or partly in further steps and the active semiconductor layer 3 can be contacted electrically e.g. by the vapor deposition of metal.

Figure 5:
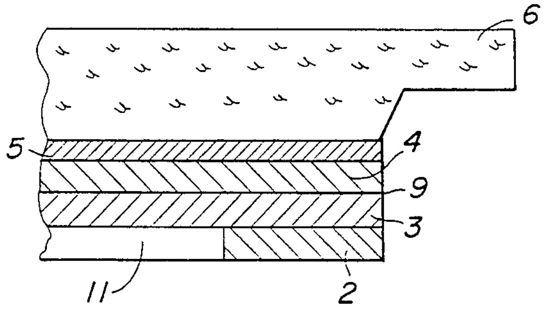

In FIG. 5 is shown a preferred embodiment in which the etch resist layer 2 is etched away in the middle 11 so that only an annular rim of the resist layer 2 remains. Due to the exact limitation at the rim, no more contacting difficulties will occur. The smooth rim limitation also prevents to a great extent the danger of the occurrence of point discharges or corona discharges when operating the photocathode in an image intensifier tube.

To achieve an exact edge limitation of a transparent photocathode it is suggested to apply to the cathode carrier a semiconductor wafer with an overhanging edge and to remove this edge mechanically after etching away the substrate layer.

What is claimed is:

1. A method of producing a transparent photocathode in which one side of a wafer shaped semiconductor substrate is provided with several superposed layers, one layer of which is an active photocathode semiconductive layer, comprising applying a multi-layer wafer to a carrier surface so that the wafer projects beyond the carrier on all sides, effecting denudation of the wafer, and after a chemical denudation has been made on the substrate at least the overhanging parts of the multilayer wafer are removed mechanically.

2. A method according to claim 1, wherein the chemical denudations are made by etching.

3. A method according to claim 1, wherein the substrate comrprises a gallium arsenide and that at least the adjoining layers and the active photocathode semiconductor layer are applied by an epitaxial process.

4. A method according to claim 1, where in there are applied epitaxially to the substrate a resist layer then an active photocathode semiconductive layer and then a protective layer and, if applicable, an adhesive coating and after this multilayer wafer has been joined to the carrier, the substrate is etched away chemically.

5. A method according to claim 4, wherein the marginal area is masked and the resist layer is then etched away.

6. A method according to claim 1, wherein the multilayer wafer is joined to a glass carrier.

7. A method according to claim 1, wherein the protective layer is produced with the same composition as the resist layer.

8. A method according to claim 7, wherein the protective layer and the resist layer are produced of GaAlAs.

* * * * *